US009541936B2

(12) United States Patent
Rivet et al.

(10) Patent No.: US 9,541,936 B2
(45) Date of Patent: Jan. 10, 2017

(54) SYSTEM FOR BALANCING THE VOLTAGE OF SERIES-CONNECTED SEMICONDUCTOR ELEMENTS

(71) Applicant: STMICROELECTRONICS (TOURS) SAS, Tours (FR)

(72) Inventors: Bertrand Rivet, Vouvray (FR); David Jouve, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 14/548,386

(22) Filed: Nov. 20, 2014

(65) Prior Publication Data

US 2015/0137880 A1 May 21, 2015

(30) Foreign Application Priority Data

Nov. 21, 2013 (FR) .................................... 13 61454

(51) Int. Cl.
G05F 1/10 (2006.01)
G05F 1/613 (2006.01)
G05F 1/46 (2006.01)
H03K 17/10 (2006.01)

(52) U.S. Cl.
CPC .............. *G05F 1/613* (2013.01); *G05F 1/468* (2013.01); *H03K 17/102* (2013.01)

(58) Field of Classification Search
CPC ... H02J 7/0016; H01M 10/482; H01M 10/441
See application file for complete search history.

(56) References Cited

U.S. PATENT DOCUMENTS

2010/0167441 A1* 7/2010 Ray .......................... G09G 3/32
438/29
2010/0201317 A1* 8/2010 Shiu ....................... H02J 7/0018
320/116

FOREIGN PATENT DOCUMENTS

WO 9525383 A1 9/1995
WO 2013091326 A1 6/2013

OTHER PUBLICATIONS

Zhou, D et al : "A Pratical Series Connection Technique for Multiple IGBT Devices", 32D. Annual IEEE Power Electronics Specialists Conference. PESC 2001. Conference Proceedings. Vancouver, Canada, Jun. 17, 2001, pp. 2151-2155.
Piazzesi, A et al : "Series connection of 3.3kV IGBTs with active voltage balancing", Power Electronics Specialists Conference, 2004. PESC 04. 2004 IEEE 35TH Annual, Aachen, Germany, Jun. 20, 2004, pp. 893-898.

* cited by examiner

*Primary Examiner* — Sibin Chen
(74) *Attorney, Agent, or Firm* — Allen, Dyer, Doppelt, Milbrath & Gilchrist, P.A.

(57) ABSTRACT

A circuit for balancing a voltage across a semiconductor element series-connected with other semiconductor elements of the same type may include a comparator configured to compare data representative of a voltage across the semiconductor element with a reference voltage, and a resistive element of adjustable value and configured to be controlled by the comparator.

18 Claims, 2 Drawing Sheets

SYSTEM FOR BALANCING THE VOLTAGE OF SERIES-CONNECTED SEMICONDUCTOR ELEMENTS

RELATED APPLICATION

This application claims the priority benefit of French Patent application number 13/61454, filed on Nov. 21, 2013, the contents of which is hereby incorporated by reference in its entirety.

TECHNICAL FIELD

The present disclosure generally relates to electronic circuits and, more generally, to a voltage-balancing system intended for series-connected semiconductor devices. The present disclosure more specifically relates to power applications.

BACKGROUND

Frequently, a plurality of semiconductor components, to which are applied, together, a relatively high voltage with respect to the individual voltages that the different components have to withstand, are series-connected. Such is in particular the case for rectifying diodes series-connected between two terminals where a high voltage is applied (typically, several hundreds of volts). Each diode then sees a voltage lower than the total voltage. Ideally, the voltage seen by each diode, or more generally by each semiconductor element, corresponds to the total voltage divided by the number of components. In practice, due to technological dispersions in the forming of semiconductor devices, to manufacturing tolerances, and dispersions due to a temperature difference between each element in the application, there frequently is a voltage imbalance between the different diodes. This may lead to a situation where one of the diodes sees, between its terminals, a voltage which exceeds the voltage that it can withstand.

Systems that include a protection resistor connected in parallel with each diode to achieve a static balance and a capacitor connected for a dynamic protection have already been provided. However, devices based on resistors in parallel with the diodes have the major disadvantage of generating permanent losses through the resistors.

SUMMARY

An embodiment of the present disclosure overcomes all or part of the disadvantages of usual balancing systems. Another embodiment provides an approach for decreasing losses with respect to a system where balancing resistors in parallel with each element are used.

Another embodiment provides a self-adaptive approach. Another embodiment provides an approach that does not use a control signal from the outside.

Thus, an embodiment provides a circuit for balancing a voltage across a semiconductor element series-connected with other semiconductor elements of the same type. The circuit includes a comparator of data representative of the voltage between the terminals of the semiconductor element with a reference voltage. The circuit also includes an adjustable value resistive element that is controlled by the comparator.

According to an embodiment, the reference voltage is representative of the voltage applied to the series association of the semiconductor elements, divided by the number of elements. According to an embodiment, the resistive element is a metal oxide semiconductor (MOS) transistor.

According to an embodiment, the comparator is a first operational amplifier having a first input receiving the data representative of the voltage between the terminals of the semiconductor element and having a second input receiving the reference voltage. According to an embodiment, the reference voltage is provided by a second operational amplifier assembled as a subtractor.

According to an embodiment, the data representative of the voltage across the semiconductor element is sampled from the midpoint of a first resistive dividing bridge connected between the terminals of the semiconductor element. According to an embodiment, the circuit comprises two first terminals intended to be connected between the terminals of said semiconductor element, and two second terminals to be respectively connected to a previous circuit and to a next circuit in the series association of the semiconductor elements.

According to an embodiment, a second resistive dividing bridge connects the two second terminals. The midpoint of the second dividing bridge is connected to a first input of the second operational amplifier having a second input connected, by a second resistive element, to the other second terminal, and by a third resistive element to one of the first terminals.

A system for self-balancing series-connected semiconductor elements includes a circuit such as described above connected in parallel on each semiconductor element. According to an embodiment, the semiconductor elements are diodes.

DETAILED DESCRIPTION

Figure 1:
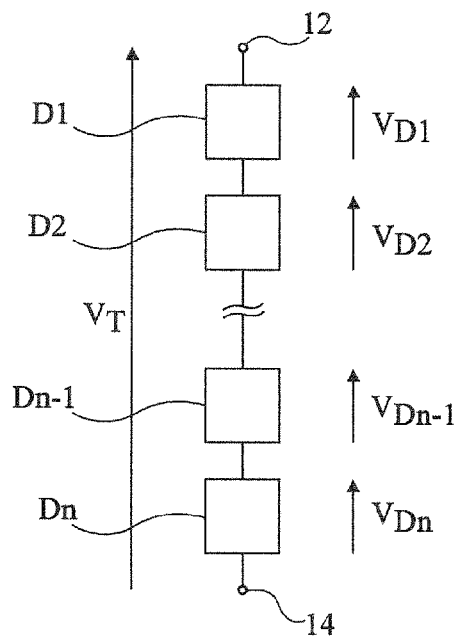
FIG. 1 is a simplified schematic diagram of a series association of semiconductor elements to which embodiments of the present invention apply.

The foregoing and other features and advantages will be discussed in detail in the following non-limiting description of specific embodiments in connection with the accompanying drawings. The same elements have been designated with the same reference numerals in the different drawings. For clarity, only those steps and elements which are useful to the understanding of the embodiments which will be described have been shown and will be detailed. In particular, the destination of a series association of semiconductor elements has not been detailed, as the described embodiments are compatible with usual applications that use a plurality of series-connected semiconductor devices.

FIG. 1 is a simplified representation of an example of a series association of elements or components $D_1, D_2, \ldots, D_{n-1}, D_n$ having a voltage $V_T$ applied between end terminals 12, 14 of their series association. Each device sees, between its terminals, a voltage $V_{Di}$ (i being in the range from 1 to n, and n standing for the number of series-connected components).

The most current applications of such series associations of semiconductor components relate to protection devices, for example, AC/DC or DC/DC voltage conversion devices such as high-voltage switched-mode power supplies capable of being used in fields such as traction, solar inverters, laser control, etc. Thus, devices $D_1$ to $D_n$, for example, are semiconductor diodes but may more generally be any semiconductor component, for example, MOS transistors, insulated-gate bipolar transistors (IGBTs), switches, Schottky diodes, zener diodes, etc.

In an assembly of the type in FIG. 1, technological dispersions between the different components may result in that one or a plurality thereof sees between their terminals a voltage which exceeds the voltage that they can withstand. Taking the example of semiconductor diodes, these are given for a repetitive reverse maximum voltage ($V_{RRM}$) and a maximum reverse current ($I_R$) corresponding to the maximum instantaneous value which, for voltage $V_{RRM}$, corresponds to the maximum junction temperature. A maximum reverse voltage ($V_{RM}$), which corresponds to value $V_{RRM}$ multiplied by a safety factor k, is then defined.

In known circuits, a resistor (not shown in FIG. 1) is connected in parallel with each diode to statistically balance the voltage, and capacitances are generally also assembled, individually and in parallel on each diode, for dynamic balancing purposes. The resistors and capacitances are sized so that the voltage across each diode of the series association does not exceed value $V_{RN}$. However, a problem of permanent resistive loss on operation of the circuit arises. Further, the resistors generally have to be sized to take the worst case into account. This results in increasing losses in normal operation.

Figure 2:
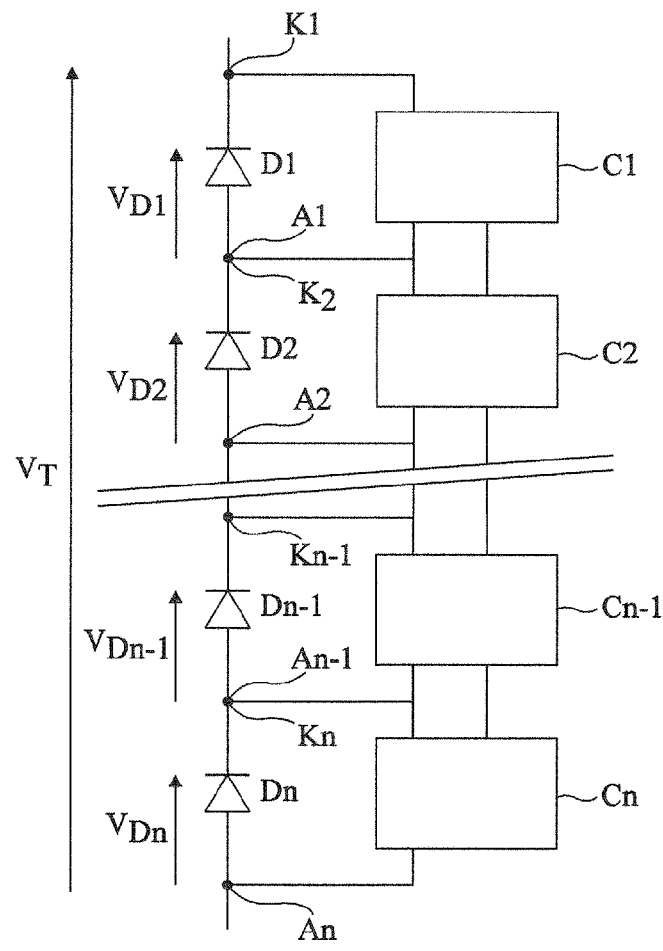
FIG. 2 is a schematic block diagram of an embodiment of a system for balancing the voltages across series-connected semiconductor elements according to the present invention.

FIG. 2 is a simplified representation of an embodiment of a system where an active circuit $C_i$ (i being in the range from 1 to n) is connected in parallel with each component, in this example, diodes $D_i$ ($D_1$ to $D_n$). Each circuit $C_i$ is connected to terminals $K_i$ and $A_i$ of the concerned diode. Since the diodes are in series, anode $A_i$ of a diode of rank i is common (or connected) to cathode $K_{i+1}$, of the diode of rank i+1. In the example of direction taken in the drawings, the cathode of diode $D_1$ defines terminal 12 of the application of the high potential of voltage $V_T$ and anode $A_n$ of diode $D_n$ defines terminal 14 of the application of the low potential of voltage $V_T$.

Each circuit $C_i$ is connected to circuits $C_{i-1}$ and $C_{i+1}$ which are adjacent thereto by its connection to the anode and cathode of the diode associated therewith (except for the first $C_1$ and last $C_n$ circuits which are only respectively connected to the next circuit $C_2$ and to the previous circuit $C_{n-1}$). Further, each circuit $C_i$ is also directly connected to its adjacent circuits $C_{i-1}$ and $C_{i+1}$, with the same exception for the first and last circuits, independently from the connection via its diode. This will better appear from the following description of FIG. 3.

Figure 3:
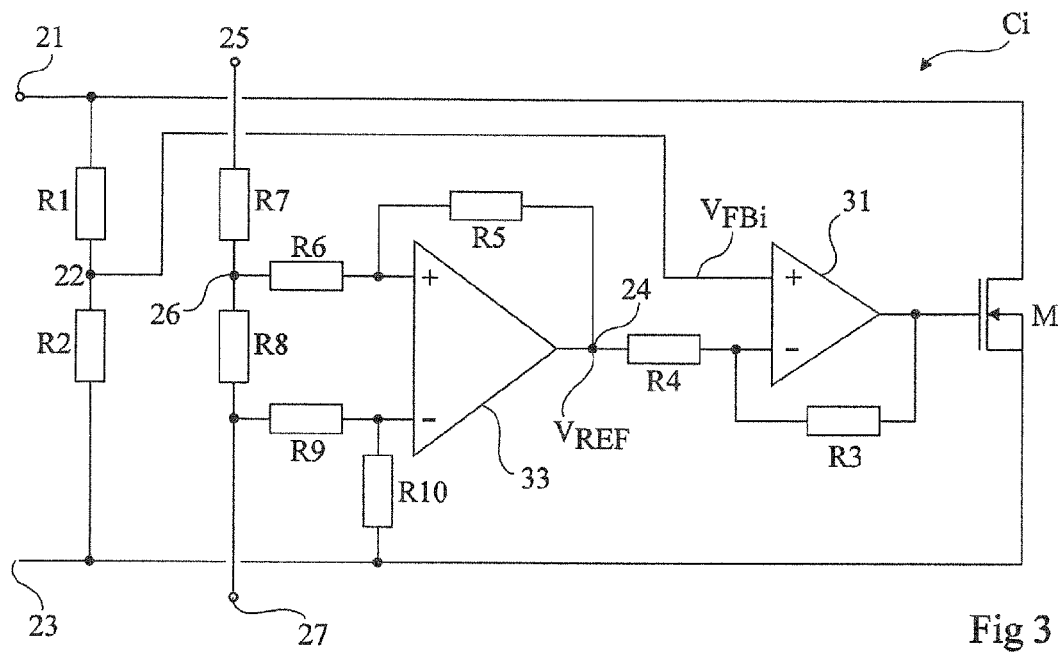
FIG. 3 is a more detailed schematic diagram of a balancing circuit of the system of FIG. 2.
Figure 4:
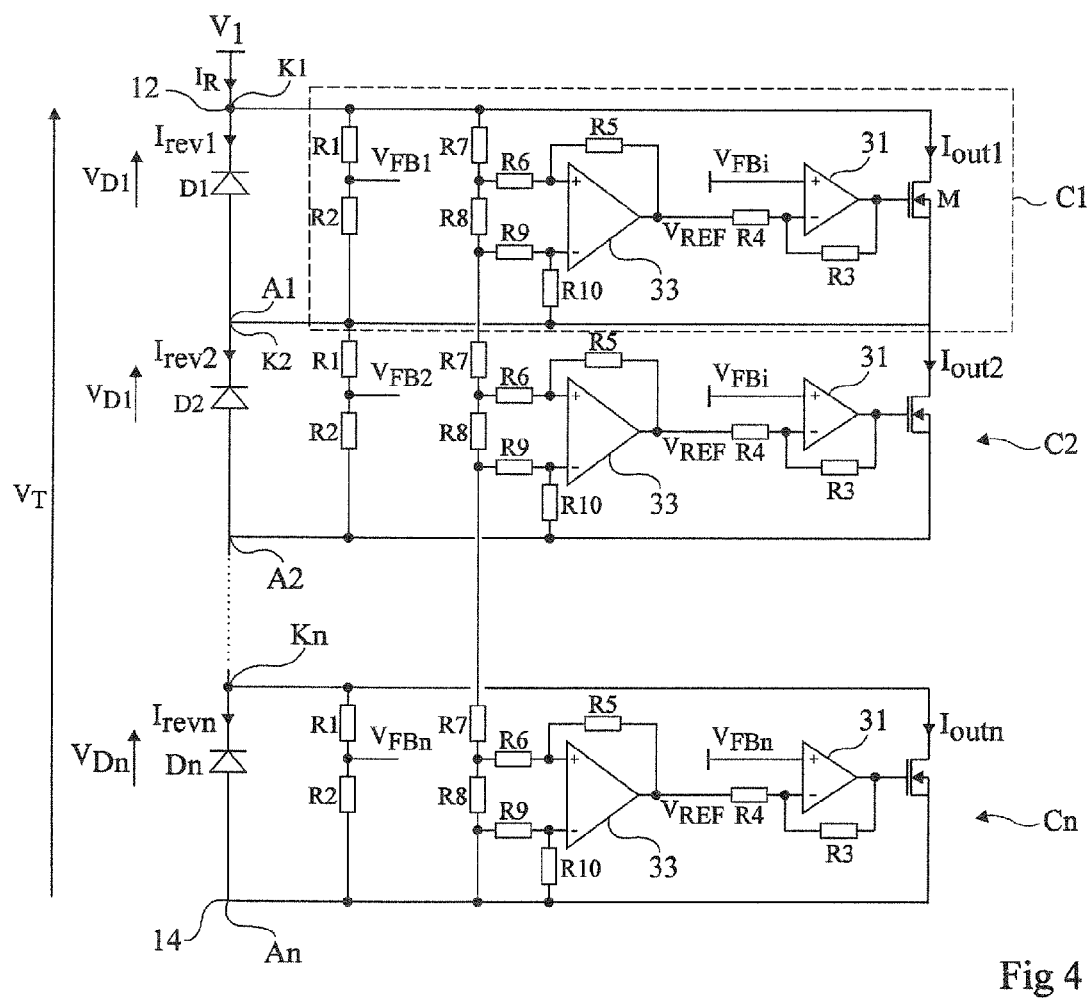
FIG. 4 is a schematic diagram of an interconnection of circuits in FIG. 3.

FIG. 3 shows the detailed electric diagram of an embodiment of a circuit $C_i$. FIG. 4 illustrates the connection (or assembly) of n circuits in a series association of n diodes.

Each circuit $C_i$ comprises two terminals 21 and 23 to be connected to respective electrodes $K_i$ and $A_i$ of the concerned diode, and two terminals 25 and 27 to be respectively connected to circuits $C_{i-1}$ and $C_{i+1}$. Circuit $C_1$ has its terminal 25 connected to its terminal 21 (and thus to terminal 12). Circuit $C_n$ has its terminal 27 connected to terminal 23 (and thus to terminal 14).

Although, in the following description of circuit $C_i$, the case of resistive elements made in the form of resistors will be taken as an example as the "resistors" may take different forms (for example, the form of MOS transistors). Indeed, the values of the resistive elements of circuit $C_i$ are compatible with an embodiment in the form of an integrated circuit.

A resistive dividing bridge formed by two resistors R1 and R2 series-connected between terminals 21 and 23 provides data $V_{FBi}$ relative to the voltage across diode $D_i$ (not shown in FIG. 3). Data $V_{FBi}$ sampled from midpoint 22 of this series association is sent onto a non-inverting terminal (+) of an operational amplifier 31 assembled as an analog comparator with a reference level $V_{REF}$. The output of amplifier 31 is connected to a control electrode of a transistor, for example, a MOS transistor M (for example, of type N). Transistor M operates in a linear mode, that is, its gate control signal varies its on-state series resistance (RdsON). Transistor M connects terminals 21 and 23. Comparator 31 is assembled as an inverter as its output is connected to its inverting input terminal (−) by a resistor R3, and reference level $V_{REF}$ is applied via a resistor R4, preferably of same value as resistor R3. The values of resistors R1 and R2 are selected according to the supply voltage of the comparator 31 and to the maximum voltage between terminals 21 and 23 (maximum voltage $V_{Di}$ capable of being seen by diode $D_i$).

Assuming that the diodes have identical characteristics (same voltage $V_{RRM}$), the resistances R1 of all circuits $C_i$ preferably have the same value, and the resistances R2 of all the circuits preferably have the same value. The same is true, on the one hand, for resistances R3, and on the other hand, for resistances R4.

Reference level $V_{REF}$ is generated by an operational amplifier 33 assembled as a subtractor and having the function of dividing by number n of diodes $D_i$ of the series association voltage $V_T$ present between terminals 12 and 14, and for each diode $D_i$, referencing this value to its anode (terminal 23 of circuit $C_i$). The non-inverting input (+) of the amplifier 33 is connected to its output 24 by a resistor R5 as well as, by a resistor R6, to junction point 26 of resistors R7 and R8, series-connected between terminals 25 and 27 of circuit $C_i$. The inverting input (−) of amplifier 33 is connected, by a resistor R9, to terminal 27 and, by a resistor R10, to terminal 23, to reference voltage $V_{REF}$ to anode $A_i$ of diode $D_i$.

Each circuit $C_i$ is connected to the adjacent circuits by its terminals 25 and 27, terminal 25 of circuit $C_i$ being connected to terminal 27 of circuit $C_{i-1}$ of lower rank and terminal 27 of circuit $C_i$ being connected to terminal 25 of circuit $C_{i+1}$ of higher rank. Terminal 25 of circuit $C_1$ is connected to terminal 12 and terminal 27 of circuit $C_n$ is connected to terminal 14.

Assuming that the diodes have identical characteristics (same voltage $V_{RRM}$), the resistances R7 of all circuits preferably have the same value, and the resistances R8 of all the circuits preferably have the same value. These values are selected according to the power supply voltage of amplifiers 33 and to the maximum values capable of being taken by voltages $V_{RRM}$ of the diodes and $V_T$. Resistances R1 and R7 have the same value and resistances R2 and R8 have the same value.

Further, resistances R5 preferably have the same value, resistances R6 preferably have the same value, resistances R9 preferably have the same value, and resistances R10 preferably have the same value. According to a specific embodiment, the values of resistances R5, R6, R9, and R10 are all identical. Resistance R3 is preferably much higher than resistance R4 (for example, by a factor between 10 and 100) to have a high gain of the system in closed loop.

Circuit $C_i$ is in charge of measuring the voltage across diode $D_i$ and of comparing this voltage to total voltage $V_T$ divided by the number of diodes, to deviate, if desired, part of the current through transistor M, and thus balance the different voltages $V_{Di}$ of the series association. The system control results in having voltage $V_{FBi}$ tending, for a balanced system, towards voltage $V_{REF}$.

In case of an imbalance, voltage $V_{FBi}$ is equal to a given ratio of voltage $V_{Di}$ while $V_{REF}$ is equal to a given ratio of voltage $V_T$. This ratio is for example equal to R/(R+R'), where R stands for the value of resistances R1 and R7, and where R' stands for the value of resistances R2 and R8. Current $I_{revi}$ in each diode $D_i$, added to current $I_{outi}$ in transistor M of circuit $C_i$ associated therewith, is identical for each diode $D_i$/balancing circuit $C_i$ association. The gain of amplifier 31 and the ratio between current $I_{outi}$ (and thus resistance $R_{dsON}$) and gate-source voltage $V_{gs}$ of transistor M is selected according to the value of total voltage $V_T$ and to number n of diodes.

An advantage of the described embodiments is that the power consumption in transistor M of the balancing circuit only occurs in the presence of an imbalance. Indeed, the power consumption due to resistive elements R1 and R10 and to amplifiers 31 and 32 is negligible since the currents are relatively low (typically less than at least 100 times the dissipation for transistor M).

The described embodiments use a power source for amplifiers 31 and 33. The power supply may be extracted from the voltage across the concerned diodes or be sampled from another voltage source of the system.

Various embodiments have been described. Various alterations, modifications, and improvements will occur to those skilled in the art. For example, in the case of diodes having nominal characteristics different from one another, the values of the different resistances should be adapted. Further, although reference has been made to a MOS transistor M to deviate the current, the element may more generally be any controllable resistive element, that is, having an adjustable resistance value, for example, a bipolar transistor. Further, the practical implementation of the described embodiments, in particular the sizing of the components of circuits $C_i$, is within the abilities of those skilled in the art based on the functional indications described above.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for balancing a voltage across a semiconductor element series-connected with other semiconductor elements of a same type, the semiconductor elements having terminals, the circuit comprising:
    a comparator configured to compare data representative of a voltage between the terminals with respect to a reference voltage representative of a voltage applied to the series-connected semiconductor element and other semiconductor elements divided by a number of semiconductor elements;
    a resistive element having an adjustable value coupled to said comparator and configured to be controlled by said comparator; and
    a first resistive dividing bridge having a midpoint and configured to be coupled between the terminals of the semiconductor element so that the data representative of the voltage between the terminals of the semiconductor element is available at the midpoint.

2. The circuit of claim 1, wherein said resistive element comprises a metal oxide semiconductor (MOS) transistor.

3. The circuit of claim 1, wherein said comparator comprises a first operational amplifier having a first input receiving the data representative of the voltage across the semiconductor element and having a second input receiving the reference voltage.

4. The circuit of claim 3, further comprising a second operational amplifier coupled to the first operational amplifier and configured as a subtractor and to generate the reference voltage.

5. The circuit of claim 4 further comprising:
    first terminals configured to be connected between the terminals of said semiconductor element;
    second terminals configured to be respectively connected to a previous circuit and to a next circuit in the series-connected semiconductor element and other semiconductor elements
    a second resistive element;
    a third resistive element; and
    a second resistive bridge coupled to said second terminals and having a midpoint, wherein said second operational amplifier has first and second inputs, and wherein the midpoint of the second resistive bridge is coupled to the first input of said second operational amplifier, wherein said second input of said second operational amplifier is coupled, by said second resistive element, to one of said second terminals, and, by said third resistive element, to one of said first terminals.

6. The circuit of claim 1, further comprising:
    first terminals configured to be connected between the terminals of said semiconductor element; and
    second terminals configured to be respectively connected to a previous circuit and to a next circuit in the series-connected semiconductor element and other semiconductor elements.

7. A system comprising:
    a plurality of series-connected semiconductor elements, each of said plurality of series-connected semiconductor elements having terminals;
    a circuit coupled in parallel on each of said plurality of series-connected semiconductor elements, said circuit comprising
        a comparator configured to compare data representative of a voltage between the terminals with respect to a reference voltage representative of a voltage applied to the plurality of series-connected semiconductor elements divided by a number of the plurality of series-connected semiconductor elements,
        a resistive element having an adjustable value coupled to said comparator and configured to be controlled by said comparator, and
        a first resistive dividing bridge having a midpoint and coupled between the terminals of a given one of said plurality of series-connected semiconductor elements so that the data representative of the voltage between the terminals of the given series-connected semiconductor element is available from the midpoint.

8. The system of claim 7, wherein said plurality of series-coupled semiconductor elements comprises diodes.

9. A method of balancing a voltage across a semiconductor element series-connected with other semiconductor elements of a same type, the semiconductor elements having terminals, the method comprising:

using a comparator to compare data representative of a voltage between the terminals with respect to a reference voltage representative of a voltage applied to the series-connected semiconductor element and other semiconductor elements divided by a number of semiconductor elements;

controlling a value of a resistive element having an adjustable value based upon the comparator; and using a first resistive dividing bridge having a midpoint and to be coupled between the terminals of the semiconductor element to make available at the midpoint the data representative of the voltage between the terminals of the semiconductor element.

10. The method of claim 9, wherein said resistive element comprises a metal oxide semiconductor (MOS) transistor.

11. The method of claim 9, wherein using the comparator comprises using a first operational amplifier having a first input receiving the data representative of the voltage across the semiconductor element and having a second input receiving the reference voltage.

12. The method of claim 11, further comprising using a second operational amplifier coupled to the first operational amplifier as a subtractor to generate the reference voltage.

13. A circuit for balancing a voltage across a semiconductor element series-connected with other semiconductor elements of a same type, the semiconductor elements having terminals, the circuit comprising:

a comparator configured to compare data representative of a voltage between the terminals with respect to a reference voltage, said comparator comprising a first operational amplifier having a first input receiving the data representative of the voltage across the semiconductor element and having a second input receiving the reference voltage;

a second operational amplifier coupled to the first operational amplifier and configured as a subtractor and to generate the reference voltage;

a resistive element having an adjustable value coupled to said comparator and configured to be controlled by said comparator; and a first resistive dividing bridge having a midpoint and configured to be coupled between the terminals of the semiconductor element so that the data representative of the voltage between the terminals of the semiconductor element is available at the midpoint.

14. The circuit of claim 13, wherein said resistive element comprises a metal oxide semiconductor (MOS) transistor.

15. The circuit of claim 13, further comprising:
first terminals configured to be connected between the terminals of said semiconductor element; and
second terminals configured to be respectively connected to a previous circuit and to a next circuit in the series-connected semiconductor element and other semiconductor elements.

16. The circuit of claim 13 further comprising:
first terminals configured to be connected between the terminals of said semiconductor element;
second terminals configured to be respectively connected to a previous circuit and to a next circuit in the series-connected semiconductor element and other semiconductor elements
a second resistive element;
a third resistive element; and
a second resistive bridge coupled to said second terminals and having a midpoint, wherein said second operational amplifier has first and second inputs, and wherein the midpoint of the second resistive bridge is coupled to the first input of said second operational amplifier, wherein said second input of said second operational amplifier is coupled, by said second resistive element, to one of said second terminals, and, by said third resistive element, to one of said first terminals.

17. A method of balancing a voltage across a semiconductor element series-connected with other semiconductor elements of a same type, the semiconductor elements having terminals, the method comprising:

using a comparator to compare data representative of a voltage between the terminals with respect to a reference voltage, the comparator comprising a first operational amplifier having a first input receiving the data representative of the voltage across the semiconductor element and having a second input receiving the reference voltage;

using a second operational amplifier coupled to the first operational amplifier as a subtractor to generate the reference voltage;

controlling a value of a resistive element having an adjustable value based upon the comparator; and using a first resistive dividing bridge having a midpoint and to be coupled between the terminals of the semiconductor element to make available at the midpoint the data representative of the voltage between the terminals of the semiconductor element.

18. The method of claim 17, wherein the resistive element comprises a metal oxide semiconductor (MOS) transistor.

* * * * *